United States Patent [19]

Voorman

[11] 4,180,785
[45] Dec. 25, 1979

[54] MODULATOR FOR FORMING THE PRODUCT OF TWO INPUT SIGNALS

[75] Inventor: Johannes O. Voorman, Eindhoven, Netherlands

[73] Assignee: U.S. Philips Corporation, New York, N.Y.

[21] Appl. No.: 900,711

[22] Filed: Apr. 27, 1978

[30] Foreign Application Priority Data

Jun. 7, 1977 [NL] Netherlands ............. 7706237

[51] Int. Cl.² ............................................. H03C 1/52
[52] U.S. Cl. .................................... 332/9 T; 325/49; 325/138; 325/141; 332/31 T; 332/44; 332/48
[58] Field of Search .......... 332/9 R, 9 T, 31 T, 332/41, 44, 45, 48, 49; 325/38 R, 44, 49, 50, 137, 138, 141, 182

[56] References Cited

U.S. PATENT DOCUMENTS 3,852,688  12/1974  Takeda .................. 332/31 T

Primary Examiner—Siegfried H. Grimm
Assistant Examiner—Edward P. Westin
Attorney, Agent, or Firm—Thomas A. Briody; William J. Streeter; Edward W. Goodman

[57] ABSTRACT

A modulator suitable for amplitude modulation includes first and second converters for converting the positive and negative excursions of first and second input signals into four respective signals of one polarity which are passed through a multiplying device and a difference producer to generate an output signal containing only the product terms of the first and second input signals.

6 Claims, 6 Drawing Figures

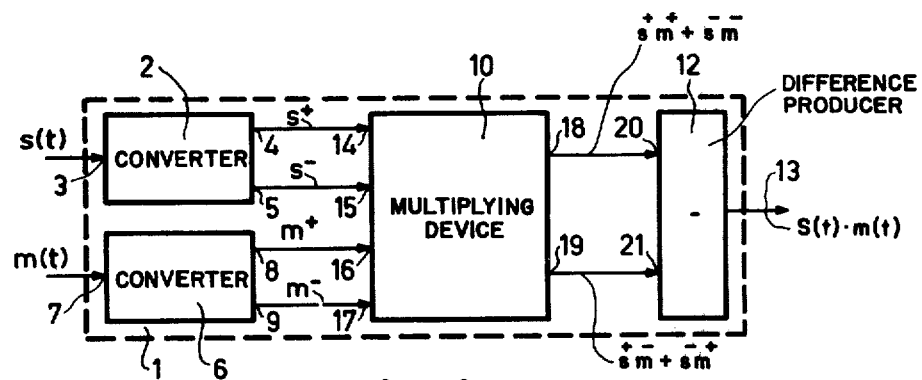
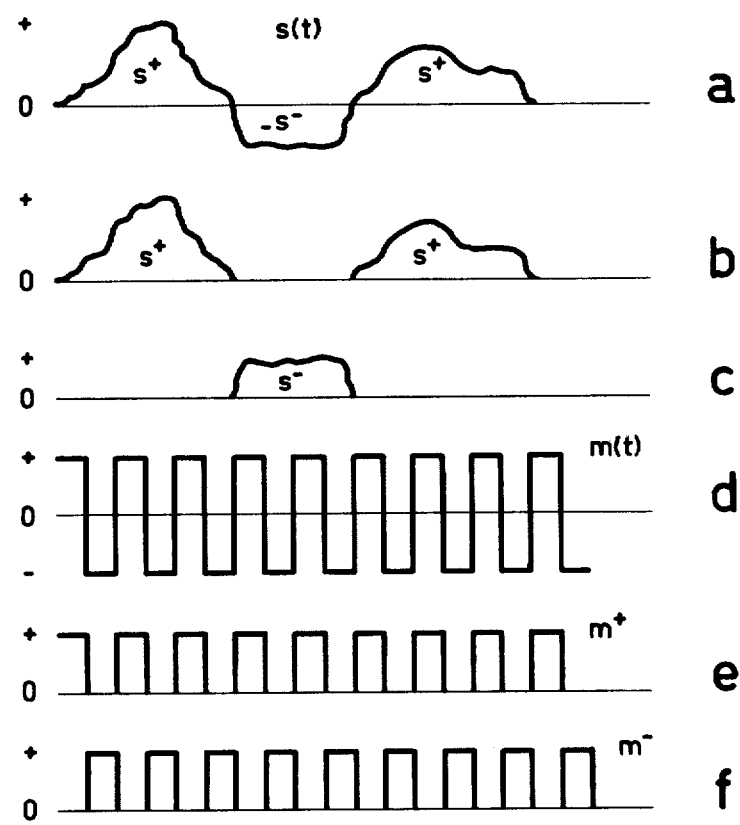
Fig. 1
Fig. 2

MODULATOR FOR FORMING THE PRODUCT OF TWO INPUT SIGNALS

The invention relates to a modulator of a type suitable for amplitude modulation of a first input signal having positive and negative excursions relative to a reference level with a second input signal also having positive and negative excursions relative to a reference level, said input signals being suppressed during the modulation process and only the product terms being obtained as an output signal.

Modulators which supply only the product terms as an output signal are usually implemented as a double-balanced modulator. Such a modulator can comprise four transistors of the same conductivity type. These transistors are arranged in two pairs. The collectors of the two transistors of each pair are interconnected and connected to an output circuit and the emitter of each transistor of one pair is interconnected with the emitter of a respective one of the two transistors of the other pair. One input signal is converted by means of a phasesplitter into two signals of opposite phase, which are applied to the respective pairs of emitter connections, whereas the other input signal is applied to the base connections of each of the two transistors which are in different pairs and have different collector connections.

A drawback of this prior art type of modulator is that the average direct current consumption is relatively high, especially when the modulator has to cope with many spurious signals besides the required signals, and a high direct current level is consequently necessary to avoid unwanted intermodulation. Furthermore, the dynamic range of such a modulator is limited.

It is an object of the invention to provide a modulator of the type referred to which mitigates the above-mentioned drawbacks.

In accordance with the invention a modulator of the type referred to is characterized in that the modulator comprises a first converter circuit for converting said first input signal into a first and a second signal current of one polarity relative to a datum level, the value of the first signal current corresponding to that of the first input signal for its positive excursions and being substantially equal to the datum level for its negative excursions, and the value of the second signal current corresponding to that of the first input signal for its negative excursions and being substantially equal to the datum level for its positive excursion and second converter circuit for converting said second input signal into a third and a fourth signal current of one polarity relative to a datum level, the value of the third signal current corresponding to that of the second input signal for its positive excursions and being substantially equal to this latter datum level for its negative excursions and the value of the fourth signal current corresponding to that of the second input signal for its negative excursions and being substantially equal to said latter datum level for its positive excursions, and a multiplying device, connected to the first and to the second converter circuits, having first and second outputs, which multiplying device supplies in response to the first, second, third and fourth signal currents derived from the two converter circuits the sum of the products of the first and third and of the second and fourth signal currents at its first output, and the sum of the products of the first and fourth and of the second and third signal currents at its second output, and a difference producer, connected to the first and second outputs of the multiplying device to produce at its output the desired modulated output signal.

In order that the invention may be more fully understood, reference will now be made by way of example to the accompanying drawings, of which:

FIG. 1 is the block diagram of a modulator according to the invention;

FIG. 2 shows a number of signal shapes for explaining the operation of the modulator of FIG. 1;

Figure 3:
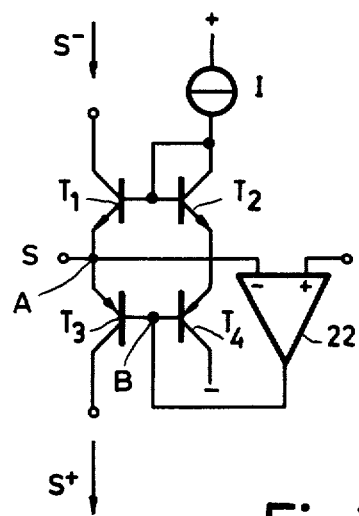
Figure 4:
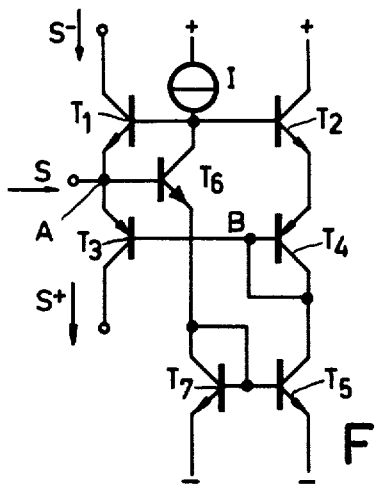
Figure 5:
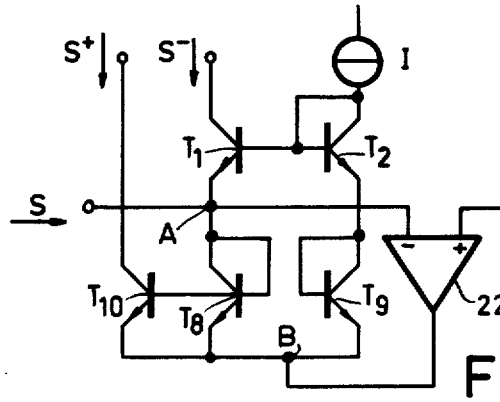
Figure 6:
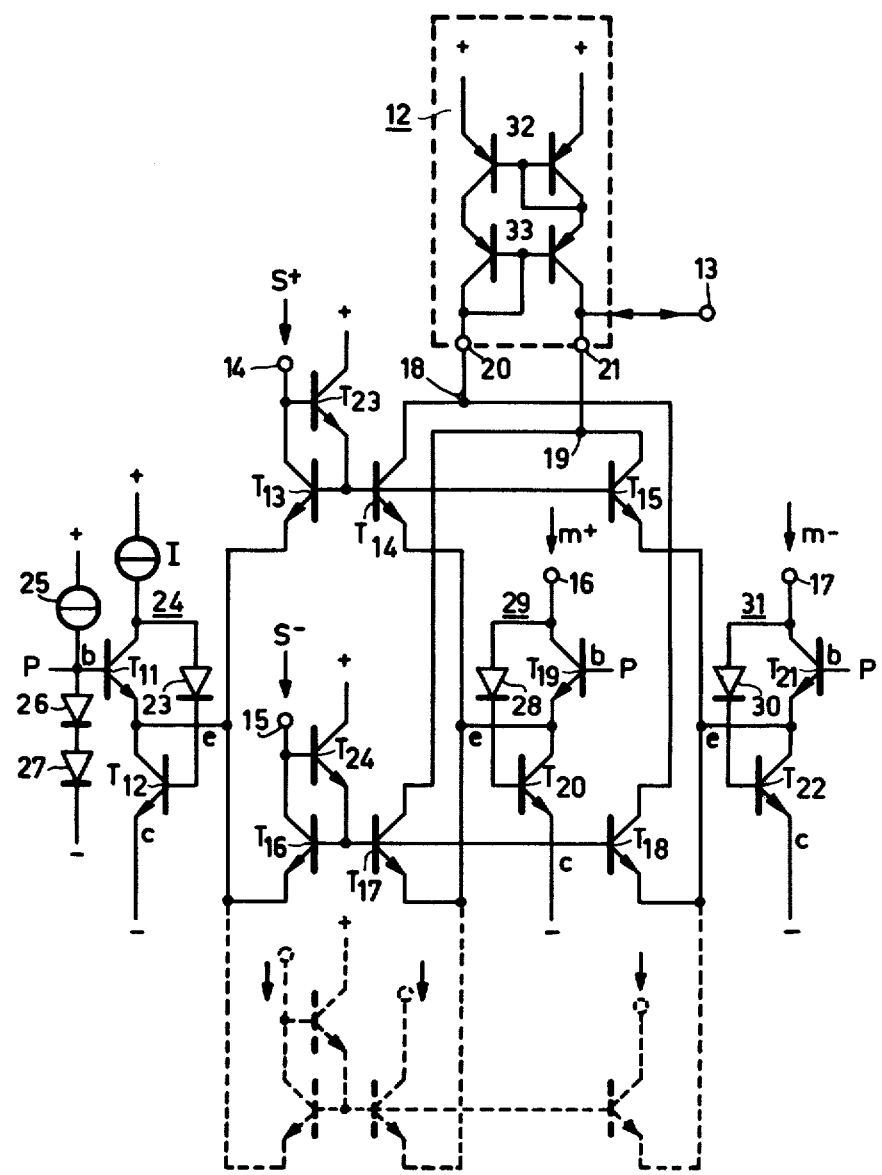

FIGS. 3, 4, and 5 show possible embodiments of the converter circuit used in the modulator shown in FIG. 1; and FIG. 6 shows an embodiment of the multiplying device used in the modulator of FIG. 1 and of the difference producer connected to the outputs thereof.

Referring to the drawings, the modulator according to the invention, indicated in FIG. 1 by reference 1, comprises: a first converter circuit 2 having an input 3 and two outputs 4 and 5; a second converter circuit 6 having an input 7 and two outputs 8 and 9; a multiplying device 10; and an output circuit in the form of a difference producer 12 having an output 13.

The multiplying device 10 has four inputs 14, 15, 16 and 17 to which the outputs of the converter circuits 2 and 6 are connected. The outputs 4 and 5 of converter circuit 2 are connected to the inputs 14 and 15 respectively, and the outputs 8 and 9 of the converter circuit 6 are connected to the inputs 16 and 17, respectively.

The multiplying device 10 has two outputs 18 and 19 which are connected to inputs 20 and 21, respectively, of the difference producer 12.

By way of explanation, FIG. 2a shows a first input signal s(t) which is applied to the input 3 of the converter circuit 2 and FIG. 2d shows a second input signal m(t) which is applied to the input 7 of the converter circuit 6. As shown in FIG. 2a, the first input signal s(t) has positive excursions s+ and negative excursions -s⁻ relative to a reference level which is shown as zero (0). The second input signal m(t) also has, as shown in FIG. 2d, positive excursions m+ and negative excursions -m⁻ relative to a reference level which is also shown as zero (0). The converter circuit 2 converts the input signal s(t) into a first and second signal currents of positive polarity, the value of the first signal current s+, as shown in FIG. 2b, corresponding to that of the input signal s(t) for its positive excursions and being (substantially) zero for its negative excursions, and the value of the second signal current s⁻, as shown in FIG. 2c, corresponding to that of the input signal s(t) for its negative excursions and being (substantially) zero for its positive excursions. The conversion circuit 6 converts the input signal m(t) into a third and fourth signal currents of positive polarity, the value of the third signal current m+, as shown in FIG. 2e, corresponding to that of the input signal m(t) for its positive excursions and being (substantially) zero for its negative excursions, and the value of the fourth signal current m⁻, as shown in FIG. 2f, corresponding to that of the input signal m(t) for its negative excursions and being (substantially) zero for its positive excursions.

The first and second signal currents s+ and s⁻ appear at the outputs 4 and 5, respectively, of the conversion circuit 2 and are applied to the inputs 14 and 15, respectively, of the multiplying device 10. The third and fourth signal currents m+ and m⁻ appear at the outputs 8 and 9, respectively, of the conversion circuit 6 and are applied to the inputs 16 and 17, respectively, of the multiplying device 10. This multiplying device 10 is implemented so that in response to the first, second, third and fourth signal currents supplied to its inputs it supplies at its first output 18 the sum of the products of the first and the third and of the second and the fourth signal currents (s+m+ +s−m−), and at its second output 19 the sum of the products of the first and the fourth and of the second and the third signal currents (s+m− +s−m+) and applies them to the output circuit 12. This output circuit 12 is constructed as a difference producer and consequently supplies $$(s^+m^+ + s^-m^-) - (s^+m^- + s^-m^+)$$

$$= (s^+ - s^-)(m^+ - m^-) = s(t)m(t)$$

which is the modulation product of the input signals applied to the inputs 3 and 7.

The conversion circuits 2 and 6 are identical of construction. FIG. 3 shows a possible embodiment of such a conversion circuit. This conversion circuit comprises four transistors $T_1$, $T_2$, $T_3$ and $T_4$, of which the transistors $T_1$ and $T_2$ are of complementary type to the transistors $T_3$ and $T_4$. The transistor $T_2$ is connected as a diode and connected to a constant current source I. The emitters of transistors $T_2$ and $T_4$ are interconnected and the collector of transistor $T_4$ is connected to a negative voltage. The bases of transistors $T_2$ and $T_4$ are connected to the bases of transistors $T_1$ and $T_3$, respectively. The emitters of transistors $T_1$ and $T_3$ are interconnected at a point A. The collector of transistor $T_1$ and the collector of transistor $T_3$ constitute the two outputs of the conversion circuit. The point A forms the input of the conversion circuit. The point A is connected to the inverting input of an operational amplifier 22, the output of which is connected to a junction B of the bases of transistors $T_3$ and $T_4$. The operational amplifier 22 maintains the input point A at a specific reference voltage (0), by having its non-inverting input connected to a suitable reference potential.

The input resistance of the circuit is particularly low. The operation of the conversion circuit can be explained as follows, in which explanation the base-emitter voltages of the transistors $T_1$ to $T_4$ are referred to as $V_{BE1}$ to $V_{BE4}$, respectively. If it is assumed that the input signal s(t) shown in FIG. 2a is applied to the input signal A then if s>0, the transistor $T_3$ becomes fully conductive because the operational amplifier 22 makes the voltage at the point B correspondingly low, this voltage being $V_{BE3} = (\beta+1)\delta$, where $\beta$=the gain factor of the operational amplifier 22 and $\delta$=the amplitude of the input signal. Transistor $T_3$ supplies the signal current s+. As current I is constant, $V_{BE4}$ does not change, the same applies for transistor $T_2$; $V_{BE2} = -V_{BE4} = KT/q \ln I/I_{co}$. Transistor $T_1$ is fully cutoff so that $V_{BE1} = -(\beta+1)\delta + 2KT/q \ln I/I_{co}$. If s<0, the transistor $T_3$ is fully cutoff as the operational amplifier 22 makes the voltage at the point B correspondingly high, $V_{BE3} = -(\beta+1)\delta$. The transistors $T_4$ and $T_2$ remain conducting and $V_{BE4}$ and $V_{BE2}$ do not change. Transistor $T_1$ is fully conducting and supplies s−, $V_{BE1} = (\beta+1)\delta + 2KT/q \ln I/I_{co}$ in this instance.

The above can also be explained as follows:
At the point A, it holds that:

$$s = s^+ - s^- \qquad (1)$$

For the ring of base-emitter junctions it holds that:

$$V_{BE1} + V_{BE3} - V_{BE4} - V_{BE2} = 0 \qquad (2)$$

From equation (2) it follows that:

$$\ln s^-/I_{co} + \ln s^+/I_{co} - 2\ln I/I_{co} = 0 \qquad (3)$$

or $$s^- \cdot s^+ = I^2 \qquad (4)$$

From the equations (1) and (4), s− and s+ can be solved as follows:

It follows from equation (4) that:

$$s^- = I^2/s^+ \qquad (5)$$

If equation (5) is introduced in equation (1) then it is found that:

$$s = s^+ - I^2/s^+$$

or $$(s^+)^2 - ss^+ - I^2 = 0$$

from which it follows that:

$$s^+ = \frac{s + \sqrt{s^2 + 4I^2}}{2} \approx \frac{s + |s|}{2} = \begin{array}{l} s, \text{ for } s > 0 \\ 0, \text{ for } s \leq 0 \end{array}$$

provided $I^2 << |s|^2$; and $$s^- = \frac{-s + \sqrt{s^2 + 4I^2}}{2} \approx \frac{-s + s}{2} = \begin{array}{l} 0, \text{ for } s \geq 0 \\ -s, \text{ for } s \leq 0 \end{array}$$

provided $I^2 << |s|^2$.

In FIG. 3 the current direction of s+ and s− is indicated by arrows and is the same for both currents.

FIG. 4 shows a further possible embodiment of the conversion circuit. In this figure, components corresponding to the components of FIG. 3 have been given the same reference numerals. Thus, this circuit also comprises the transistors $T_1$ and $T_3$ whose emitters are interconnected at the point A, the point A again constituting the input of the circuit. In addition, the circuit comprises a transistor $T_2$ of the same conductivity type as the transistor $T_1$. The collector of $T_2$ is connected to a positive voltage whereas the emitter is connected to a negative voltage via a transistor $T_4$, which is connected as a diode, and the collector-emitter path of a further transistor $T_5$. The bases of the transistors $T_1$ and $T_2$ are interconnected and connected to a constant current source I. The bases of the transistors $T_3$ and $T_4$ are also interconnected.

With this embodiment, the operational amplifier is realized in a simple manner by a further, bipolar, npn transistor $T_6$, whose base is connected to the input point A and whose collector-emitter path connects the current source I via a transistor $T_7$, which is connected as a diode, to said negative voltage. The base of transistor $T_7$ is connected to the base of transistor $T_5$. The output of the operational amplifier is constituted by the junction of base and collector of the transistor $T_4$, which is connected as a diode. The signal occurring at this output is low if the input signal applied to the input point A is positive, so that the transistor $T_3$ is rendered fully conductive, whereas the transistor $T_1$ is cutoff. If the input signal applied to the input point A is negative, the output signal of the operational amplifier, that is to say the junction of base and collector of the transistor $T_4$ which is connected as a diode, is high then and transistor $T_3$ is cut off, whereas transistor $T_1$ is rendered conductive.

In the embodiments described so far, of the conversion circuit, use has been made of two pairs of complementary type transistors $T_1$, $T_3$ and $T_2$, $T_4$ respectively.

FIG. 5 shows a possible embodiment of the conversion circuit wherein only transistors of the same conductivity type are used. In this Figure, components corresponding to the components of FIG. 3 have been given the same reference numerals. As this Figure shows, the transistors $T_3$ and $T_4$ of FIG. 3 are replaced by the transistors $T_8$ and $T_9$ which are connected as diodes. The collectors of these transistors $T_8$ and $T_9$ are connected to the emitters of the transistors $T_1$ and $T_2$, respectively, whereas the emitter of these transistors $T_8$ and $T_9$ are connected to the point B. In addition, a transistor $T_{10}$ is included, whose base is connected to the base of transistor $T_8$ and whose emitter is connected to the point B. The collectors of the transistors $T_1$ and $T_{10}$ constitute the outputs of the conversion circuit.

FIG. 6 shows in greater detail an embodiment of the multiplying device 10 used in the modulator shown in FIG. 1 and an embodiment of the difference producer 12 connected to the outputs of this multiplying device.

In FIG. 6, the inputs and outputs of the multiplying device 10 and difference producer 12 corresponding to those of FIG. 1 have been given the same reference numerals.

The multiplying device comprises a transistor $T_{11}$ which is connected together with a transistor $T_{12}$ and a diode 23 in known manner to form a compound transistor 24 having base b, emitter e and collector c. The base b is connected to a point P at which a voltage occurs which is generated by means of a current source 25 and two series-connected diodes 26 and 27. The free electrode, constituted by the collector of transistor $T_{11}$, of the compound transistor is connected to a current source I. The emitter e of the compound transistor is connected to the junction of the emitters of two transistors $T_{13}$ and $T_{16}$.

The multiplying device further comprises two transistors $T_{14}$ and $T_{15}$ whose bases are connected to the base of transistor $T_{13}$ and whose emitters are connected respectively to the emitters of two transistors $T_{17}$ and $T_{18}$, whose bases are connected in common to the base of transistor $T_{16}$. The multiplying device also comprises a transistor $T_{19}$ which is connected, together with a transistor $T_{20}$ and a diode 28, in known manner for forming another compound transistor 29 having base b, emitter e and collector c. The base b of this artificial transistor 29 is also connected to the point P, and its emitter e is connected to the junction of the emitters of transistors $T_{14}$ and $T_{17}$. In addition, a transistor $T_{21}$, together with a transistor $T_{22}$ and a diode 30, forms a third compound transistor 31 having base b, emitter e and collector c. The base b is again connected to the point P, whereas the emitter of the compound transistor 31 is connected to the junction of the emitters of transistors $T_{15}$ and $T_{18}$. The collectors c of the compound transistors 24, 29 and 31 are connected to a negative potential. The transistors $T_{13}$ and $T_{16}$ are base-current compensated by the transistors $T_{23}$ and $T_{24}$, respectively. The collector of transistor $T_{13}$ is connected to the input terminal 14 to which the signal current $s^+$ is applied. The collector of transistor $T_{16}$ is connected to the input terminal 15 to which the signal current $s^-$ is applied. The collector of transistor $T_{19}$ is connected to the input terminal 16 to which the signal current $m^+$ is applied and the collector of transistor $T_{21}$ is connected to the input terminal 17 to which the signal current $m^-$ is applied. The collector of transistor $T_{14}$ and the collector of transistor $T_{18}$ are connected to the output terminal 18, and the collector of transistor $T_{15}$ and the collector of transistor $T_{17}$ are connected to the output terminal 19. The transistors $T_{11}$, $T_{13}$, $T_{14}$ and $T_{19}$ form a first multiplier which produces the product of the signal currents $s^+$ and $m^+$ at the output terminal 18. The product signal is equal to $s^+m^+/I$. The transistors $T_{11}$, $T_{16}$, $T_{18}$ and $T_{21}$ form a second multiplier which produces the product of the signal currents $s^-$ and $m^-$ at the output terminal 18. This product signal is equal to $s^-m^-/I$. Consequently, the sum signal $(s^+m^+ + s^-m^-)/I$ occurs as an output signal at the output terminal 18. The transistors $T_{11}$, $T_{13}$, $T_{15}$ and $T_{21}$ form a third multiplier which produces the product of the signal currents $s^+$ and $m^-$ at the output terminal 19. This product signal is equal to $s^+m^-/I$. The transistors $T_{11}$, $T_{16}$, $T_{17}$ and $T_{19}$ form a fourth multiplier which produces the product of the signal currents $s^-$ and $m^+$ at the output terminal 19. This product signal is equal to $s^-m^+/I$. Consequently, the sum signal $(s^+m^- + s^-m^+)/I$ occurs as an output signal at the output terminal 19.

It should be noted that each of the multipliers is active only if the signal currents applied to the relevant multiplier both exceed zero simultaneously. This condition is never satisfied for more than one of the multipliers simultaneously. Consequently, these multipliers operate sequentially. This has the important technical effect that a particularly effective suppression of the modulator input signal and a considerable reduction in the direct current consumption is obtained. As the modulator operates in class AB or B, the dynamic range can be considerably wider (e.g. 30–40 dB) than that of the customary modulators, which all operate in class A.

The desired modulator/output signal is equal to:

$$s(t) \cdot m(t) = (s^+m^+ + s^-m^-) - (s^+m^- + s^-m^+).$$

Consequently, the sum signals occurring at the output terminals 18 and 19 of the multiplier device must only be subtracted from one another. This can be done in a simple manner by connecting to the output terminals 18 and 19 a difference producer 12 in the form of two current mirrors 32 and 33 arranged in series in known manner, which apply identical currents to the terminals 18 and 19. If the product signal currents $s^+m^+/I$ and $s^-m^-/I$, respectively, are derived from terminal 18 via the respective transistors $T_{14}$ and $T_{18}$ the difference producer 12 supplies an identical current to terminal 19. Because the transistors $T_{15}$ and $T_{17}$ are cut off if transistors $T_{14}$ and $T_{18}$ are conductive, the current supplied by the difference producer 12 to the terminal 19 flows via the output 13 to a load (not shown) connected to this output. If the transistors $T_{15}$ and $T_{17}$ are conductive, they carry the product signal currents $s^+m^-/I$ and $s^-m^+/I$, respectively. Now, the transistors $T_{14}$ and $T_{18}$ are cut off and the difference producer 12 does not supply current to terminal 18 and therefore also not to terminal 19. The current flowing in the transistors $T_{15}$ and $T_{17}$, respectively, is consequently withdrawn from the load via output terminal 13.

As the currents corresponding to the product signals $s^+m^+/I$ and $s^-m^-/I$ are applied to the load and the currents corresponding to the product signals $s^+m^-/I$ and $s^-m^+/I$ are withdrawn from the load, the load sees difference:

$$s^+m^+/I+s^-m^-/I-s^+m^-/I-s^-m^+/I=s(t)\cdot m(t)/I$$

that is to say, the product of the input signals.

It should be noted that the multiplying device shown in FIG. 6 is not limited to four product terms, but can be extended in a simple manner to more than four product terms, which can be achieved in FIG. 6 by means of the extension indicated by means of dashed lines.

What is claimed is:

1. A modulator for amplitude modulation of a first input signal having positive and negative excursions relative to a reference level with a second input signal also having positive and negative excursions relative to a reference level, said input signals being suppressed during the modulator process and only the product terms being obtained as an output signal, wherein the modulator comprises a first converter circuit for converting said first input signal into a first and a second signal current of one polarity relative to a datum level, the value of the first signal current corresponding to that of the first input signal for the positive excursions of the first input signal and being substantially equal to the datum level for the negative excursions of the first input signal, the value of the second signal current corresponding to that of the first input signal for the negative excursions of the first input signal and being substantially equal to the datum level for the positive excursions of the first input signal, a second converter circuit for converting said second input signal into a third and a fourth signal current of one polarity relative to said datum level, the value of the third signal current corresponding to that of the second input signal for the positive excursions of said second input signal and being substantially equal to said datum level for the negative excursions of said second input signal and the value of the fourth signal current corresponding to that of the second input signal for the negative excursions of said second input signal and being substantially equal to said datum level for the positive excursions of said second input signal, and a multiplying device coupled to the first and to the second converter circuits and having first and second outputs, said multiplying device supplying in response to the first second third and fourth signal currents derived from the two converter circuits the sum of the products of the first and third and of the second and fourth signal currents at said first output and supplying the sum of the products of the first and fourth and of the second and third signal currents at said second output, and a difference producer coupled to the first and second outputs of the multiplying device and having an output for producing the desired modulated output signal.

2. A modulator as claimed in claim 1, wherein each of the first and second converter circuits comprises a first pair of emitter-coupled complementary transistors, the junction of said emitters comprising an input of the converter circuit and the collectors of these transistors each comprising an output of the conversion circuit; a second pair of emitter-coupled complementry transistors, the bases of the transistors of the same conductivity type of both pairs of transistors being intercoupled and the collector of a transistor of said second pair being coupled to a current source and to its own base, the collector of the other transistor of said second pair being adapted to be coupled to a supply potential, and an operational amplifier having inverting and non-inverting inputs and an output, the inverting input being coupled to the input of the converter circuit and the non-inverting input being adapted to be coupled to a reference potential, the output of said operational amplifier being coupled to the base of the transistor having a collector adapted to be coupled to the supply potential.

3. A modulator as claimed in claim 1, wherein the first and second converter circuits each comprise a first pair of emitter-coupled complementary transistors, the junction of said emitter comprising the input of the converter circuit; a bipolar transistor, a diode transistor, a further transistor; and a second pair of emitter-coupled complementary transistors, the bases of the transistors of the same conductivity type of both pairs of transistors being intercoupled, the collector of one of the transistors of said second pair being adapted to be coupled to a supply potential, the collector of the other transistor of said second pair being coupled to its own base and to the collector of said further transistor, said further transistor emitter being adapted to be coupled to a supply potential of opposite polarity to the first-mentioned supply potential, a direct current source being connected to the bases of two transistors of the same conductivity type of both pairs of transistors and to one main electrode of said bipolar transistor, said bipolar transistor having a base coupled to the input of the converter circuit, and another main electrode adapted to be coupled through said diode coupled transistor to a supply potential of said opposite polarity, the base of the diode coupled transistor being coupled to the base of said first transistor.

4. A modulator as claimed in claim 1, wherein the first and second converter circuits each have an input comprising the junction of the emitter of a first transistor and the collector of a diode coupled second transistor, the base of said second transistor being coupled to the base of a third transistor, the collectors of the first and the third transistors comprising the outputs of the converter circuits and the base of said first transistor being connected to the base of a diode coupled fourth transistor, the fourth transistor collector being adapted to be coupled to a direct current source, the fourth transistor emitter being coupled to the collector of a diode coupled fifth transistor, the fifth transistor emitter being coupled to the emitter of the second and third transistor, and an operational amplifier having an inverting input coupled to the input of the converter circuit, a non-inverting input adapted to be coupled to a reference potential, and an output coupled to said fifth transistor emitter.

5. A modulator as claimed in any preceding claim, wherein the multiplying device comprises a first transistor having a base adapated to be coupled to a reference potential, a collector coupled to a current source, and an emitter adapted to be coupled to a supply potential and coupled to the emitters of second and third transistors, the base of the second transistor being coupled to the bases of fourth and fifth transistors, the base of the third transistor being coupled to the bases of sixth and seventh transistors, the emitters of said fourth and fifth transistors being coupled respectively to the emitters of eighth and ninth transistors, the base of each of said sixth and ninth transistors being adapted to be coupled to said reference potential, the emitters of said sixth and seventh transistors being coupled respectively to the emitters of said eighth and ninth transistors, the collectors of said second third eighth and ninth transistors comprising the inputs for the first second third and fourth signal currents respectively, the collectors of the fourth and seventh transistors are interconnected to a first output and the collectors of the sixth and fifth transistors are interconnected to a second output of the multiplying device.

6. A modulator as claimed in any of claims 1, 2, 3, or 4, wherein the difference producer connected to the first and second outputs of the multiplying device comprises the series arrangement of two current mirrors.

* * * * *